United States Patent
Lee et al.

(10) Patent No.: US 9,188,999 B2
(45) Date of Patent: Nov. 17, 2015

(54) VOLTAGE REGULATOR, VOLTAGE REGULATING SYSTEM, MEMORY CHIP, AND MEMORY DEVICE

(71) Applicant: Samsung Electronics Co., Ltd., Suwon-si (KR)

(72) Inventors: Joo-Sung Lee, Seoul (KR); Dong-Hun Heo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/894,678

(22) Filed: May 15, 2013

(65) Prior Publication Data

US 2014/0016425 A1 Jan. 16, 2014

(30) Foreign Application Priority Data

Jul. 12, 2012 (KR) ........................ 10-2012-0076215

(51) Int. Cl.
| | |
|---|---|
| G05F 1/10 | (2006.01) |
| H02J 1/00 | (2006.01) |
| G11C 5/14 | (2006.01) |
| G05F 1/56 | (2006.01) |
| G05F 1/565 | (2006.01) |
| G11C 29/02 | (2006.01) |

(52) U.S. Cl.
CPC .. *G05F 1/10* (2013.01); *G05F 1/56* (2013.01); *G05F 1/565* (2013.01); *G11C 5/14* (2013.01); *G11C 29/021* (2013.01); *G11C 29/028* (2013.01); *H02J 1/00* (2013.01); *Y10T 307/406* (2015.04)

(58) Field of Classification Search
CPC .... G11C 29/02; G11C 29/026; G11C 29/028; G11C 29/50; G11C 16/30; G06F 1/3203; G06F 1/26
See application file for complete search history.

(56) References Cited

U.S. PATENT DOCUMENTS

| | | | |
|---|---|---|---|
| 6,111,806 A * | 8/2000 | Shirley et al. | 365/226 |
| 6,232,753 B1 * | 5/2001 | Pasotti et al. | 323/267 |
| 6,469,480 B2 | 10/2002 | Kanakubo | |
| 6,535,443 B1 | 3/2003 | OuYang et al. | |
| 6,806,690 B2 | 10/2004 | Xi | |
| 7,142,044 B2 | 11/2006 | Sano | |
| 7,362,079 B1 | 4/2008 | Maheedhar et al. | |
| 7,795,856 B2 | 9/2010 | Aota | |
| 7,847,530 B2 * | 12/2010 | Takagi | 323/280 |
| 8,026,703 B1 | 9/2011 | Damaraju et al. | |
| 8,120,338 B2 * | 2/2012 | Kawagishi et al. | 323/272 |

(Continued)

FOREIGN PATENT DOCUMENTS

JP 2005107948 4/2005

*Primary Examiner* — Hoai V Ho
*Assistant Examiner* — Tri Hoang
(74) *Attorney, Agent, or Firm* — Onello & Mello, LLP

(57) ABSTRACT

A voltage regulator comprises a power source terminal configured to supply a power source voltage; an output terminal configured to output a load current; a first transistor which is connected between the power source terminal and the output terminal, is enabled by a signal applied from an amplifier in a first mode to generate a first current, and outputs the first current to the output terminal; and a second transistor which is connected between the power source terminal and the output terminal, is enabled by a signal applied from the amplifier in a second mode to generate a second current different from the first current, and outputs the second current to the output terminal, wherein the first transistor is enabled in the second mode, and the second transistor is disabled in the first mode.

7 Claims, 18 Drawing Sheets

(56) References Cited

U.S. PATENT DOCUMENTS

2002/0024838 A1* 2/2002 Takeuchi et al. ............. 365/145
2002/0097627 A1* 7/2002 Sacco et al. .................. 365/226
2005/0068092 A1 3/2005 Sano
2009/0322297 A1* 12/2009 Shiota ......................... 323/282
2011/0148386 A1* 6/2011 Dhuyvetter et al. .......... 323/311

* cited by examiner

VOLTAGE REGULATOR, VOLTAGE REGULATING SYSTEM, MEMORY CHIP, AND MEMORY DEVICE

CROSS-REFERENCE TO RELATED APPLICATION

This U.S. non-provisional application claims priority under 35 U.S.C. §119 to Korean Patent Application No. 10-2012-0076215, filed on Jul. 12, 2012, in the Korean Intellectual Property Office, and all the benefits accruing therefrom under 35 U.S.C. 119, the contents of which are herein incorporated by reference in their entirety.

BACKGROUND

1. Technical Field

The present inventive concepts relate to a voltage regulator, voltage regulating system, memory chip, and memory device.

2. Description of the Related Art

Various portable electronic devices have been provided with the development of electronic, information and communication technology. Generally, these portable electronic devices are operated by supplying power to the portable electronic device from a battery mounted therein. Thus, in recent years, the life or duration of the battery has been regarded as an important factor in performance of the portable electronic devices, and studies have been actively conducted to maximize efficiency of the limited capacity of the battery.

In one method of efficiently using the battery capacity, there is a method of dividing operation modes of the portable electronic devices into an active mode for high-performance operation and a power saving mode for minimizing power consumption, and managing the power consumption of the devices differently according to whether the portable electronic device is in the active mode or the power saving mode.

SUMMARY

The present inventive concepts provide a voltage regulator with improved operational reliability.

The present inventive concepts also provide a voltage regulating system which includes the voltage regulator, thereby improving operational reliability and optimizing power consumption.

The present inventive concepts also provide a memory chip which includes the voltage regulator, thereby improving operational reliability and optimizing power consumption.

The present inventive concepts also provide a memory device which includes the voltage regulator, thereby improving operational reliability and optimizing power consumption.

The present inventive concepts are not limited thereto, and the other features and elements of the present inventive concepts will be described in or be apparent from the following description of the example embodiments.

According to an aspect of the present inventive concepts, there is provided a voltage regulator comprising: a power source terminal configured to supply a power source voltage; an output terminal configured to output a load current; and a first transistor connected between the power source terminal and the output terminal. In a first mode, the first transistor is enabled by a signal applied from an amplifier to generate a first current, and the first transistor outputs the first current to the output terminal. The voltage regulator further includes a second transistor connected between the power source terminal and the output terminal. In a second mode, the second transistor is enabled by a signal applied from the amplifier to generate a second current different from the first current, the second transistor outputs the second current to the output terminal. The first transistor is enabled in the second mode, and the second transistor is disabled in the first mode.

In some embodiments, a size of the first transistor is different from a size of the second transistor.

In some embodiments, the size of the second transistor is larger than the size of the first transistor.

In some embodiments, the second current is larger than the first current.

In some embodiments, the first mode comprises a power saving mode and the second mode comprises an active mode.

In some embodiments, the voltage regulator further comprises a feedback network connected between output terminal and the amplifier, and the first transistor and the second transistor are connected in parallel between the power source terminal and the output terminal.

In some embodiments, the load current is the first current in the first mode, and the load current is a sum of the first current and the second current in the second mode.

In some embodiments, the voltage regulator further comprises a third transistor connected between the power source terminal and the output terminal, wherein, in a third mode different from the first and second modes, the third transistor is enabled by a signal applied from the amplifier to generate a third current different from the first and second currents, and wherein the third transistor outputs the third current to the output terminal.

In some embodiments, the first transistor is enabled in the third mode, the second transistor is enabled in the third mode, and the third transistor is disabled in the first and second modes.

In some embodiments, a size of the third transistor is larger than a size of the second transistor, and the size of the second transistor is larger than a size of the first transistor.

According to another aspect of the present inventive concepts, there is provided a voltage regulator comprising: a power source terminal configured to supply a power source voltage; an output terminal configured to output a load current; a first transistor which have a first terminal connected to the power source terminal, a second terminal connected to the output terminal, and a gate terminal connected to an amplifier; and a second transistor which have a first terminal connected to the power source terminal, a second terminal connected to the output terminal, and a gate terminal connected to one end of each of a first switch and a second switch, wherein the other end of the first switch is connected to the power source terminal, and the other end of the second switch is connected to the amplifier.

In some embodiments, the first switch is turned on in a first mode, and turned off in a second mode and wherein the second mode is different from the first mode.

In some embodiments, the second switch is turned off in the first mode, and turned on in the second mode.

In some embodiments, the first mode comprises a power saving mode, and the second mode comprises an active mode.

In some embodiments, the first transistor and the second transistor comprise PMOS transistors.

In some embodiments, the voltage regulator further comprises a third transistor having a first terminal connected to the power source terminal, a second terminal connected to the output terminal, and a gate terminal connected to one end of each of a third switch and a fourth switch, wherein the other end of the third switch is connected to the power source terminal, and the other end of the fourth switch is connected to the amplifier.

In some embodiments, in a first mode, the first switch and the third switch are turned on, and the second switch and the fourth switch are turned off. In a second mode different from the first mode, the second switch and the third switch are turned on, and the first switch and the fourth switch are turned off. In a third mode different from the first and second modes, the second switch and the fourth switch are turned on, and the first switch and the third switch are turned off.

In some embodiments, a size of the first transistor is different from a size of the second transistor.

In some embodiments, the size of the second transistor is larger than the size of the first transistor.

According to still another aspect of the present inventive concepts, there is provided a voltage regulating system comprising: a load block which includes a first load block and a second load block, a first load current being required to drive the first load block, and a second load current being required to drive the second load block; and a voltage regulator which provides the first and second load currents to the load block, wherein the voltage regulator includes first and second transistors connected in parallel between a power source terminal and the load block, wherein, when driving the first load block, the second transistor of the voltage regulator is disabled and the first transistor of the voltage regulator is enabled to generate the first load current, and wherein, when driving the second load block, the first and second transistors of the voltage regulator are enabled to generate the second load current.

In some embodiments, a magnitude of a first current generated by the first transistor is different from a magnitude of a second current generated by the second transistor.

In some embodiments, the magnitude of the second current is larger than the magnitude of the first current.

In some embodiments, the second load current is a sum of the first current and the second current.

In some embodiments, the load block further comprises a third load block, a third load current being required to drive the third load block, wherein the voltage regulator further comprises a third transistor connected in parallel between the power source terminal and the load block, wherein, when driving the first load block, the second transistor and the third transistor of the voltage regulator are disabled and the first transistor of the voltage regulator is enabled to generate the first load current, wherein, when driving the second load block, the third transistor of the voltage regulator is disabled, and the first transistor and the second transistor of the voltage regulator are enabled to generate the second load current, and, wherein, when driving the third load block, the first transistor, the second transistor and the third transistor of the voltage regulator are enabled to generate the third load current.

In some embodiments, a magnitude of a third current generated by the third transistor is larger than a magnitude of a second current generated by the second transistor, and the magnitude of the second current generated by the second transistor is larger than a magnitude of a first current generated by the first transistor.

In some embodiments, the third load current is a sum of the first current, the second current and the third current.

According to still another aspect of the present inventive concepts, there is provided a memory chip comprising: a memory cell array including a plurality of memory cells; and a voltage regulator which generates a load current to apply the load current to the memory cells, wherein the voltage regulator includes: a power source terminal configured to supply a power source voltage; an output terminal configured to output the load current; a first transistor connected between the power source terminal and the output terminal, wherein, in a first mode, the first transistor is enabled by a signal applied from an amplifier to generate a first load current, and wherein the first transistor provides the first load current to drive N memory cells (N is a natural number) among the plurality of memory cells; and a second transistor connected between the power source terminal and the output terminal, wherein, in a second mode, the second transistor is enabled by a signal applied from the amplifier in to generate a second load current larger than the first load current, and wherein, the second transistor provides the second load current to drive M memory cells (M is a natural number greater than N) among the plurality of memory cells, wherein the first transistor is enabled in the second mode, and the second transistor is disabled in the first mode.

In some embodiments, the voltage regulator is disposed in a controller of the memory chip.

In some embodiments, the first mode and the second mode are determined by an address signal.

According to still another aspect of the present inventive concepts, there is provided a memory device comprising: a plurality of memory chips; and a controller which generates a load current and drives the memory chips using the load current, wherein the controller includes a voltage regulator, and the voltage regulator includes: a power source terminal configured to supply a power source voltage; an output terminal configured to output the load current; a first transistor connected between the power source terminal and the output terminal, wherein, in a first mode, the first transistor is enabled by a signal applied from an amplifier to generate a first load current, and wherein the first transistor provides the first load current to drive N memory chips (N is a natural number) among the plurality of memory chips; and a second transistor connected between the power source terminal and the output terminal, wherein, in a second mode, the second transistor is enabled by a signal applied from the amplifier to generate a second load current larger than the first load current, and provides the second load current to drive M memory chips (M is a natural number greater than N) among the plurality of memory chips, wherein the first transistor is enabled in the second mode, and the second transistor is disabled in the first mode.

According to still another aspect of the present inventive concepts, there is provided a voltage regulator which includes a power source terminal configured to supply a power source voltage, an output terminal configured to output a load current, an amplifier amplifying at least a portion of a voltage of the output terminal, a first transistor connected between the power source terminal and the output terminal, and a second transistor connected between the power source terminal and the output terminal. In a first mode, the first transistor is enabled by a signal applied from an amplifier to generate a first current and the second transistor is disabled. In a second mode, the first transistor is enabled by a signal applied from an amplifier to generate the first current and the second transistor is enabled by a signal applied from an amplifier to generate a second current.

In some embodiments, a size of the first transistor is different from a size of the second transistor.

In some embodiments, the second current is larger than the first current.

In some embodiments, the first mode comprises a power saving mode and the second mode comprises an active mode.

In some embodiments, the load current is the first current in the first mode, and the load current is a sum of the first current and the second current in the second mode.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
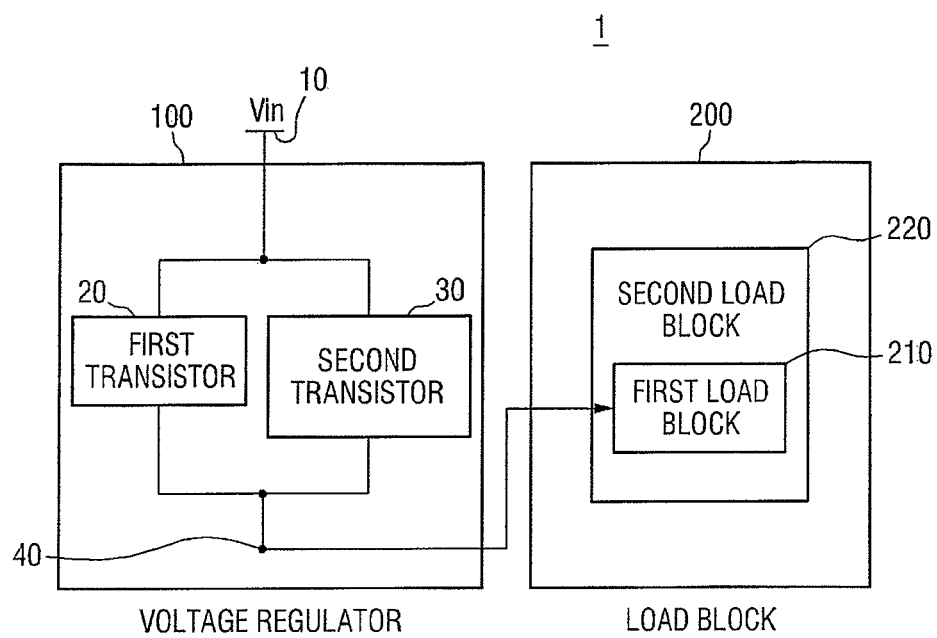
FIG. 1 is a conceptual block diagram of a voltage regulating system in accordance with an example embodiment of the present inventive concepts.

Various example embodiments of the inventive concepts will be described more fully hereinafter with reference to the accompanying drawings, in which some example embodiments are shown. The present inventive concepts may, however, be embodied in many different forms and should not be construed as being limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a decide and are not intended to limit the scope of the present inventive concepts.

FIG. 1 is a conceptual block diagram of a voltage regulating system in accordance with an example embodiment of the present inventive concepts.

Referring to FIG. 1, a voltage regulating system 1 includes a load block 200, and a voltage regulator 100.

The load block 200 may include a first load block 210 and a second load block 220, wherein a first load current is required to drive the first load block 210, and a second load current is required to drive the second load block 220. In this example embodiment, the second load current may be larger than the first load current. That is, a larger amount of current may be required to drive the second load block 220 than the first load block 210.

In some embodiments of the present inventive concepts, the first load block 210 and the second load block 220 may overlap each other, as illustrated in FIG. 1. That is, components included in the first load block 210 may be also included in the second load block 220. A specific example thereof may be as follows.

If the first load block 210 is a block including ten components among a plurality of components, the second load block 220 may be a block including the ten components included in the first load block 210 and forty components which are not included in the first load block 210. In this case, assuming that the load current of 1 is required to drive the ten components included in the first load block 210, the load current of 5 is required to drive the fifty components included in the second load block 220. A detailed description thereof will be described later.

Although a case where the first load block 210 and the second load block 220 overlap each other has been illustrated in FIG. 1, the present inventive concepts are not limited thereto. In some embodiments of the present inventive concepts, the first load block 210 and the second load block 220 may not overlap each other. That is, if the first load block 210 is a block including ten components among a plurality of components, the second load block 220 may be a block including fifty components which are not included in the first load block 210. Further, in some other embodiments of the present inventive concepts, if the first load block 210 is a block including ten first components, the second load block 220 may be a block including ten second components different from the first components. In this embodiment, a larger amount of current may be required to drive one second component than one first component.

The voltage regulator 100 may provide the first and second load currents for driving the first and second load blocks 210 and 220 of the load block 200, respectively, to the load block 200. In this embodiment, the voltage regulator 100 may include first and second transistors 20 and 30 connected in parallel between a power source terminal 10 and the load block 200, or an output terminal 40 of voltage regulator 100. The size of the first transistor 20 and the size of the second transistor 30 may be different from each other. Accordingly, a magnitude of the current generated by the first transistor 20 may be different from a magnitude of the current generated by the second transistor 30.

Specifically, in this example embodiment, the size of the first transistor 20 may be smaller than the size of the second transistor 30. Accordingly, the magnitude of the current generated by the first transistor 20 may be smaller than the magnitude of the current generated by the second transistor 30.

Hereinafter, a specific operation of the voltage regulating system of FIG. 1 in accordance with the example embodiment of the present inventive concepts will be described with reference to FIGS. 2 and 3.

Figure 2:
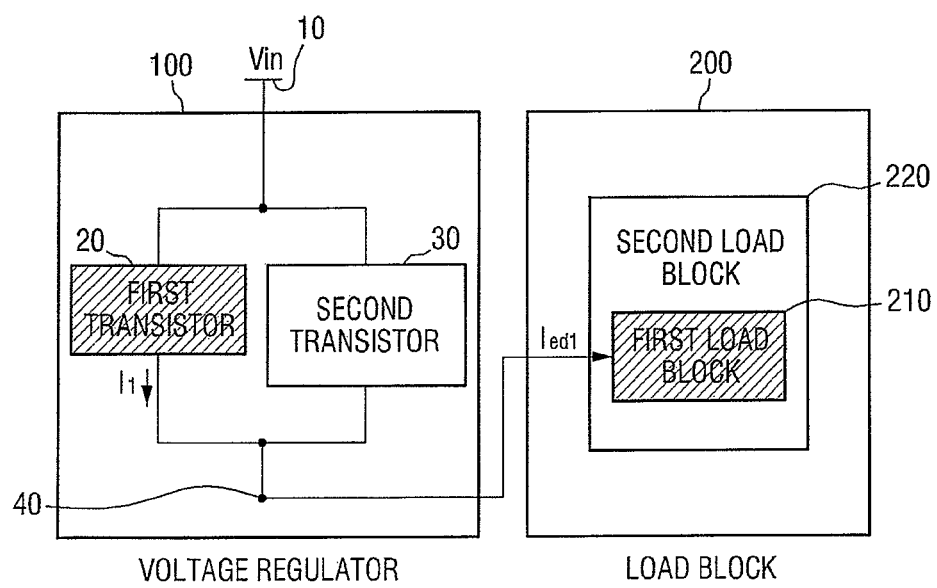
FIGS. 2 and 3 are block diagrams illustrating operation of the voltage regulating system of FIG. 1 in accordance with the example embodiment of the present inventive concepts.
Figure 2:
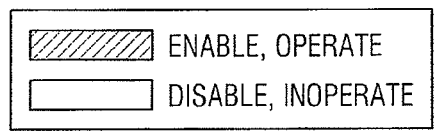
Figure 3:
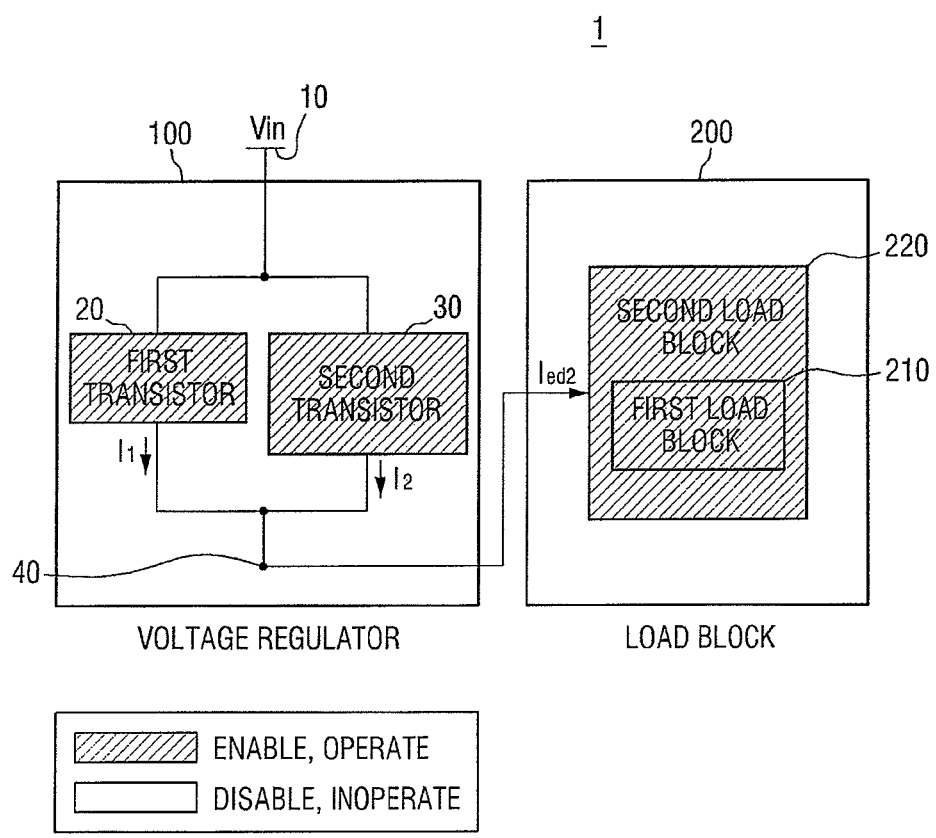

FIGS. 2 and 3 are block diagrams illustrating the operation of the voltage regulating system 100 of FIG. 1 in accordance with the example embodiment of the present inventive concepts.

First, referring to FIG. 2, when it is required to drive the first load block 210, the voltage regulator 100 operates in a first mode, for example, power saving mode. Specifically, the voltage regulator 100 generates a first load current Ied1 for driving the first load block 210, and provides the first load current Ied1 to the first load block 210. At this time, the second transistor 30 of the voltage regulator 100 is disabled, while the first transistor 20 is enabled to generate a first current I1. The generated first current I1 is provided to the output terminal 40 and is provided as the first load current Ied1 to the first load block 210.

Then, referring to FIG. 3, when it is required to drive the second load block 220, the voltage regulator 100 operates in a second mode, for example, active mode. Specifically, the voltage regulator 100 generates a second load current Ied2 for driving the second load block 220, and provides the second load current Ied2 to the second load block 220. An example embodiment in which the first load block 210 is also driven while the second load block 220 is driven will be described as an example.

In order to generate the second load current Ied2, both the first transistor 20 and the second transistor 30 of the voltage regulator 100 may be enabled. Specifically, the first transistor 20 may be enabled to generate the first current I1, and the second transistor 30 may also be enabled to generate a second current I2. In this example embodiment, a magnitude of the first current I1 generated by the first transistor 20 may be different from a magnitude of the second current I2 generated by the second transistor 30. Specifically, the magnitude of the second current I2 may be larger than the magnitude of the first current I1.

The first and second currents I1 and I2 generated by the first and second transistors 20 and 30, respectively, may be combined at the output terminal 40 to be provided as the second load current Ied2 to the second load block 220. That is the second load current Ied2 may be a sum of the first current I1 and the second current I2.

Hereinafter, the voltage regulator of FIG. 1 in accordance with the example embodiment of the present inventive concepts will be described in detail with reference to FIG. 4.

Figure 4:
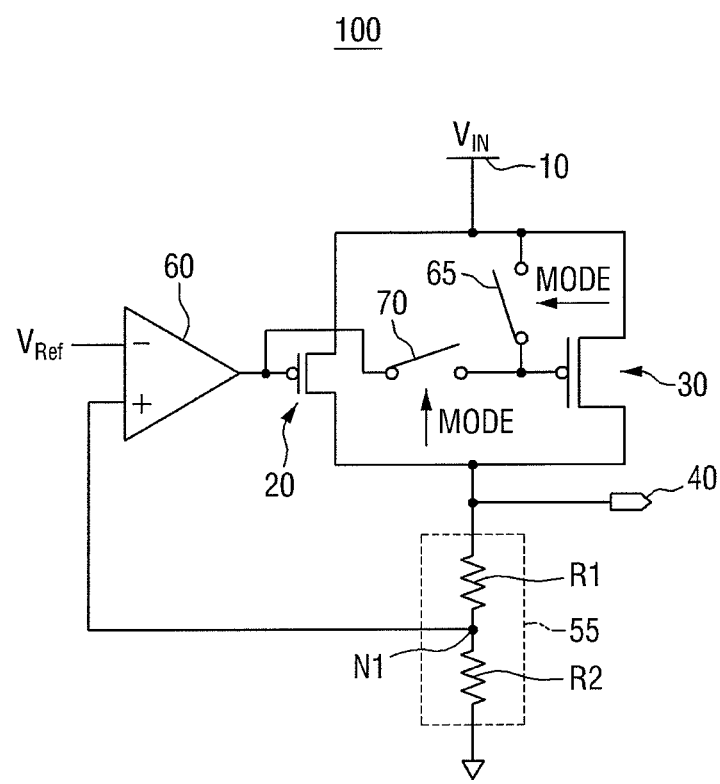
FIG. 4 is a circuit diagram of the voltage regulator of FIG. 1 in accordance with the example embodiment of the present inventive concepts.

FIG. 4 is a circuit diagram of the voltage regulator 100 of FIG. 1 in accordance with the example embodiment of the present inventive concepts.

Referring to FIG. 4, the voltage regulator 100 includes the first transistor 20, the second transistor 30, a feedback network 55, and an amplifier 60.

The first transistor 20 may be connected between the power source terminal 10, which supplies a voltage of a power source Vin, and the output terminal 40, which outputs the load current (not shown). Specifically, as illustrated, the first transistor 20 may have a first terminal connected to the power source terminal 10, a second terminal connected to the output terminal 40, and a gate terminal connected to the amplifier 60.

The first transistor 20 according to this example embodiment may be enabled by a signal applied from the amplifier 60 in the first mode (e.g., power saving mode) to generate the first current (not shown) and output the first current to the output terminal 40. A more specific operation of the first transistor 20 will be described hereinafter.

The second transistor 30 may also be connected between the power source terminal 10, which supplies the voltage of the power source Vin, and the output terminal 40, which outputs the load current (not shown). In this example embodiment, the second transistor 30 may be connected in parallel with the first transistor 20 between the power source terminal 10 and the output terminal 40, as illustrated. Specifically, the second transistor 30 may have a first terminal connected to the power source terminal 10, a second terminal connected to the output terminal 40, and a gate terminal connected to one end of each of a first switch 65 and a second switch 70. As illustrated, tone end of the first switch 65 may be connected to the gate of the second transistor 30 and another end may be connected to the power source terminal 10. One end of the second switch 70 may be connected to the gate of the second transistor 30 and the other end of the second switch 70 may be connected to the amplifier 60.

In this embodiment, each of the first and second switches 65 and 70 may be turned on/off according to a mode of the voltage regulator 100. Specifically, the first switch 65 may be turned on in a first mode, for example, a power saving mode, and turned off in a second mode, for example, an active mode. The second switch 70 may be turned off in the first mode, for example, the power saving mode, and turned on in the second mode, for example, the active mode. In some embodiments of the present inventive concepts, the first and second switches 65 and 70 may be implemented using additional transistors (not shown) other than the first and second transistors 20 and 30, but the present inventive concepts are not limited thereto. By switching the first and second switches 65 and 70 such that the first switch 65 is off, that is, in an open position, and the second switch 70 is on, that is, in a closed position, the second transistor 30 may be enabled by a signal applied from the amplifier 60 in the second mode, for example, the active mode, to generate a second current (not shown) and output the second current to the output terminal 40. A more specific operation of the second transistor 30 will be described hereinafter.

In some embodiments of the present inventive concepts, both the first transistor 20 and the second transistor 30 may be configured as PMOS transistors as illustrated; however, the present inventive concepts are not limited thereto.

In some embodiments of the present inventive concepts, the size of the first transistor 20 may be different than the size of the second transistor 30. Specifically, the size of the second transistor 30 may be larger than the size of the first transistor 20. Accordingly, although not shown, a magnitude of the second current (not shown) generated by the second transistor 30 may be larger than a magnitude of the first current (not shown) generated by the first transistor 20.

The first and second transistors 20 and 30 may be included in one voltage regulator 100. That is, the voltage regulator 100 according to this example embodiment may include the first and second transistors 20 and 30 which are separated from each other and have different sizes.

The feedback network 55 may include a first resistor R1 and a second resistor R2 connected at a node N1. One end of the first resistor R1 may be connected to the output terminal 40 and the other end of the first resistor R1 may be connected at the node N1. One end of the second resistor R2 may be connected to the node N1 and the other end of second resistor R2 may be connected to a power source, for example, ground. The amplifier 60 receives a feedback voltage from the feedback network 55 and a reference voltage Vref and outputs a signal.

The feedback network 55 and the amplifier 60 may serve to apply a voltage of the output terminal 40 to the gate terminal of the first and second transistors 20 and 30. Specifically, one end of the feedback network 55 may be connected to the output terminal 40, and the other end of the feedback network 55 may be connected to the amplifier 60 such that the feedback network 55 serves to apply at least a portion of the voltage of the output terminal 40 to the amplifier 60. Further, the amplifier 60 may serve to amplify the voltage provided from the feedback network 55 after comparison with a reference voltage Vref. The amplified voltage may be provided to the gate terminal of the first and second transistors 20 and 30, as illustrated.

In the configuration of FIG. 4, the voltage regulator 100 according to this example embodiment may provide the first and second load currents (not shown) having different magnitudes from each other to the output terminal 40. Hereinafter, the operation of the voltage regulator 100 of FIG. 4 in accordance with the example embodiment of the present inventive concepts will be described in more detail with reference to FIGS. 5 and 6.

Figure 5:
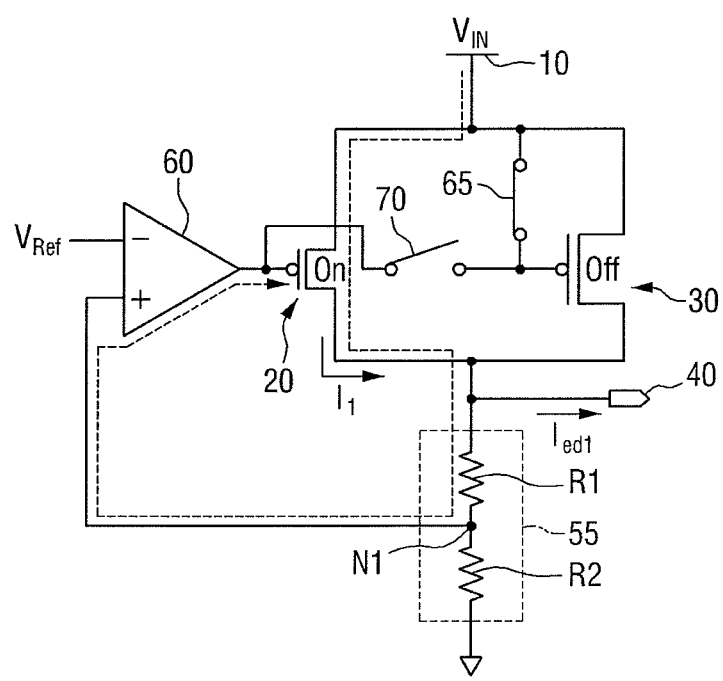
FIGS. 5 and 6 are circuit diagrams illustrating operation of the voltage regulator of FIG. 4 in accordance with the example embodiment of the present inventive concepts.
Figure 6:
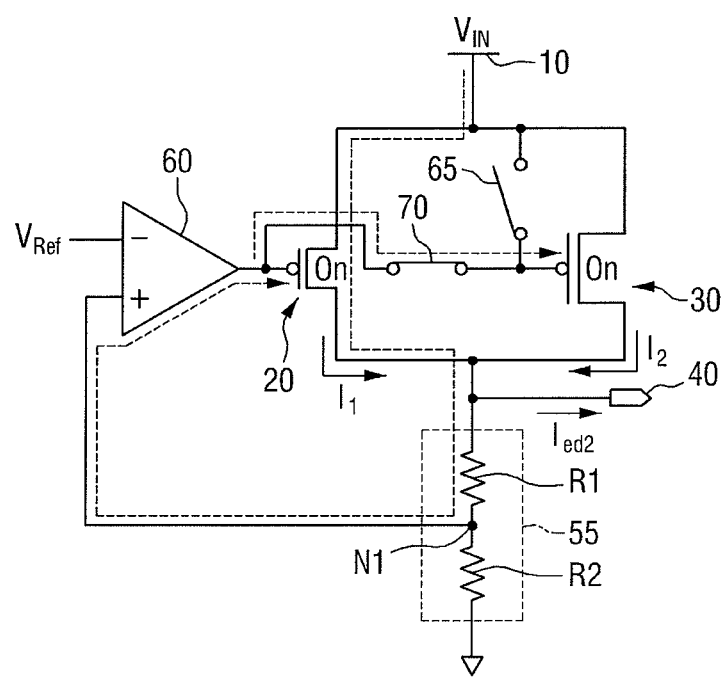

FIGS. 5 and 6 are block diagrams illustrating the operation of the voltage regulator 100 of FIG. 4 in accordance with the example embodiment of the present inventive concepts.

First, referring to FIG. 5, in the first mode, for example, the power saving mode, the voltage supplied from the power source Vin is inverted and amplified through the feedback network 55 and the amplifier 60 to be supplied from the amplifier 60 to the gate terminal of the first transistor 20. Thus, the first transistor 20 is enabled. At this time, the second switch 70 is off, and the inverted and amplified voltage is not provided to the gate terminal of the second transistor 30 (see dashed line). Since the first switch 65 is on and the voltage of the power source Vin is supplied to the gate terminal of the second transistor 30, the second transistor 30 is disabled. That is, in the first mode, for example, the power saving mode, the first transistor 20 is enabled and the second transistor 30 is disabled.

Accordingly, the first transistor 20 generates the first current I1 and provides the first current I1 to the output terminal 40, but the second transistor 30 does not generate a current. Thus, the first current I1 is outputted as the first load current Ied1 to the output terminal 40.

Next, referring to FIG. 6, in the second mode, for example, the active mode, the voltage supplied from the power source Vin is inverted and amplified through the feedback network 55 and the amplifier 60 to be supplied from the amplifier 60 to the gate terminal of the first transistor 20. Thus, the first transistor 20 is enabled. Further, the second switch 70 is on, and, thus, the inverted and amplified voltage from the amplifier 60 is also provided to the gate terminal of the second transistor 30. Thus, the second transistor 30 is also enabled (see dashed line). At this time, the first switch 65 is off and the voltage of the power source Vin is not supplied to the gate terminal of the second transistor 30. That is, in the second mode, for example, the active mode, both the first transistor 20 and the second transistor 30 are enabled.

Accordingly, the first transistor 20 generates the first current I1 and provides the first current I1 to the output terminal 40, and the second transistor 30 generates the second current I2 and provides the second current I2 to the output terminal 40. Consequently, the sum of the first current I1 and the second current I2 is outputted as the second load current Ied2 to the output terminal 40. In this example embodiment, since the size of the second transistor 30 is larger than the size of the first transistor 20, the magnitude of the second current I2 generated by the second transistor 30 may be larger than the magnitude of the first current I1 generated by the first transistor 20.

In the embodiment in which the first load current Ied1 and the second load current Ied2 having different magnitudes are generated according to the mode in one, single voltage regulator 100, it is possible to improve operational reliability. Hereinafter, the performance of the voltage regulator 100 in accordance with the example embodiment of the present inventive concepts will be described with reference to FIG. 7.

Figure 7:
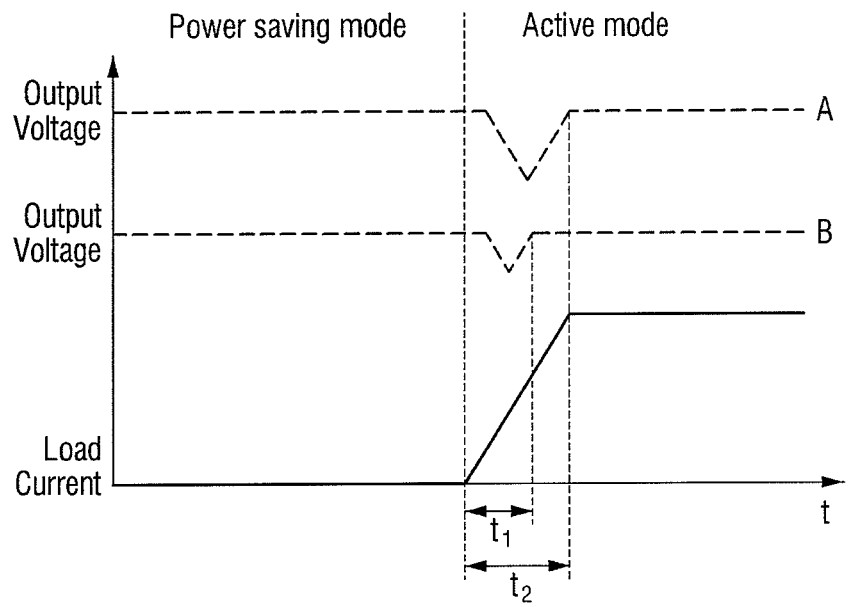
FIG. 7 is a graph illustrating performance of the voltage regulator in accordance with the example embodiment of the present inventive concepts.

FIG. 7 is a graph illustrating the performance of the voltage regulator 100 in accordance with the example embodiment of the present inventive concepts.

Referring to FIG. 7, line A is a graph illustrating an output voltage of a convention embodiment in which a first voltage regulator generates a first load current Ied1 and a second voltage regulator generates a second load current Ied2, and the first voltage regulator and the second voltage regulator are configured to be separated from each. Line B is a graph illustrating an output voltage of this example embodiment, in which a first transistor 20 generates the first load current Ied1, a second transistor 30 generates the second load current Ied2, and the first and second transistors 20 and 30 are configured to be integrated into one voltage regulator 100.

Referring to FIG. 7, in the embodiment of line A, it is illustrated that when the portable electronic device transitions from the first mode, for example, the power saving mode, to the second mode, for example, the active mode, the output voltage fluctuates during a relatively long period t2. A certain amount of time is required until a feedback loop, or the like, operates normally, when the second voltage regulator is configured separately from the first voltage regulator to generate the second load current Ied2. As a result, the log period t2 of voltage fluctuation occurs.

In the embodiment of line B, it is illustrated that when is the portable electronic device transitions from the first mode, for example, the power saving mode to the second mode, for example, the active mode, the output voltage fluctuates only during a relatively short period t1. That is, as illustrated in the example embodiment of line B, as a result of the fluctuation of the output voltage being smaller, the operational reliability is higher compared to the conventional embodiment illustrated by line A. A certain amount of time is not required until normal operation is obtained, since the first load current Ied1 and the second load current Ied2 having different magnitudes are generated in one voltage regulator, unlike the conventional embodiment illustrated by line A. That is, in case of the voltage regulating system 1 in accordance with the example embodiment of the present inventive concepts, it is possible to improve the operational reliability and optimize the power consumption.

Next, a voltage regulating system in accordance with another example embodiment of the present inventive concepts will be described with reference to FIG. 8.

Figure 8:
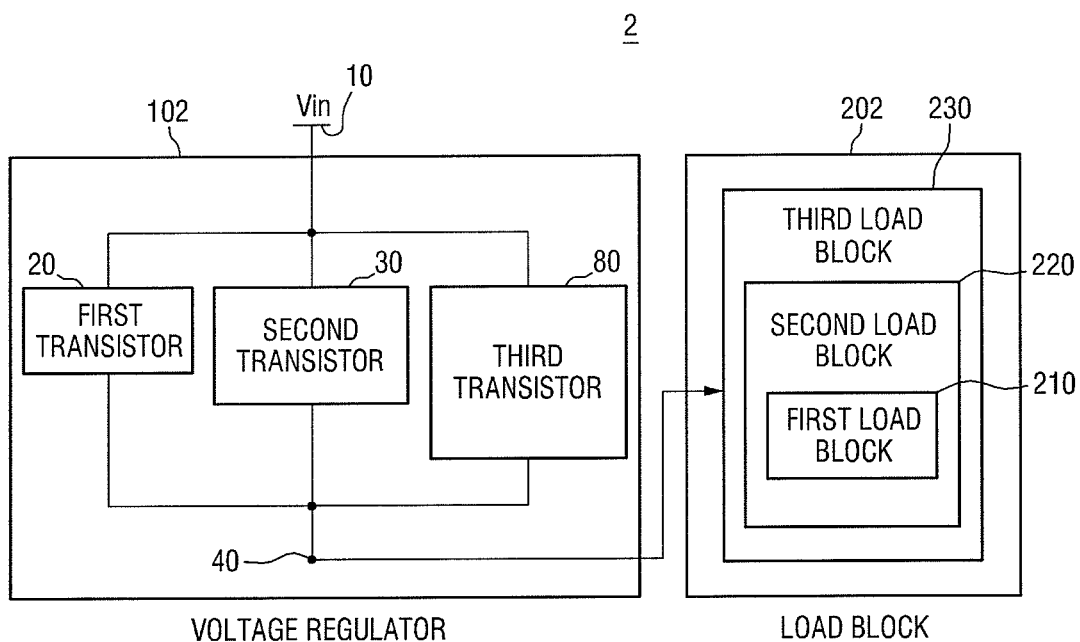
FIG. 8 is a conceptual block diagram of a voltage regulating system in accordance with an example embodiment of the present inventive concepts.

FIG. 8 is a conceptual block diagram of a voltage regulating system 2 in accordance with another example embodiment of the present inventive concepts.

Referring to FIG. 8, a voltage regulating system 2 includes a load block 202 and a voltage regulator 102.

The load block 202 may include a first load block 210, a second load block 220, and a third load block 230, wherein a first load current is required to drive the first load block 210, a second load current is required to drive the second load block 220, and a third load current is required to drive the third load block 230. In this embodiment, the second load current may be larger than the first load current, and the third load current may be larger than the second load current. That is, a larger amount of current may be required to drive the second load block 220 than the first load block 210, and a larger amount of current may be required to drive the third load block 230 than the second load block 220.

In some embodiments of the present inventive concepts, the first, second and third load blocks 210, 220 and 230 may overlap each other as illustrated; however, the present inventive concepts are not limited thereto. In some other example embodiments of the present inventive concepts, the first, second and third load blocks 210, 220 and 230 may not overlap each other.

The voltage regulator 102 may provide the first, second and third load currents for driving the first, second and third load blocks 210, 220 and 230 of the load block 202, respectively, to the load block 202. In this embodiment, the voltage regulator 102 may include first, second and third transistors 20, 30 and 80 connected in parallel between the power source terminal 10 and the load block 202, or the output terminal 40 of the voltage regulator 202.

In some embodiments of the present inventive concepts, the sizes of the first, second and third transistors 20, 30 and 80, respectively, may be different from each other. Accordingly, the magnitudes of the currents generated by the first, second and third transistors 20, 30 and 80 may be different from each other.

Specifically, in this example embodiment, the size of the first transistor 20 may be smaller than the size of the second transistor 30, and the size of the second transistor 30 may be smaller than the size of the third transistor 80. Accordingly, the magnitude of the current generated by the first transistor 20 may be smaller than the magnitude of the current generated by the second transistor 30, and the magnitude of the current generated by the second transistor 30 may be smaller than the magnitude of the current generated by the third transistor 80.

When driving the first load block 210, the voltage regulator 102 operates in the first mode, for example, the power saving mode, in which the voltage regulator 102 generates the first load current Ied1 for driving the first load block 210. The voltage regulator 102 provides the first load current Ied1 to the first load block 210. Then, when driving the second load block 220, the voltage regulator 102 operates in a second mode, for example, the first active mode, in which the voltage regulator 102 generates the second load current Ied2 for driving the second load block 220. The voltage regulation 102 provides the second load current Ied2 to the second load block 220. Then, when driving the third load block 230, the voltage regulator 102 operates in a third mode, for example, a second active mode, in which the voltage regulator 102 generates a third load current Ied3 for driving the third load block 230. The voltage regulator 102 provides the third load current Ied3 to the third load block 230. An example embodiment in which the first and second load blocks 210 and 220 are driven while the third load block 230 is driven will be described as an example.

Hereinafter, the voltage regulator 102 in accordance with the example embodiment of FIG. 8 of the present inventive concepts will be described in detail with reference to FIG. 9.

Figure 9:
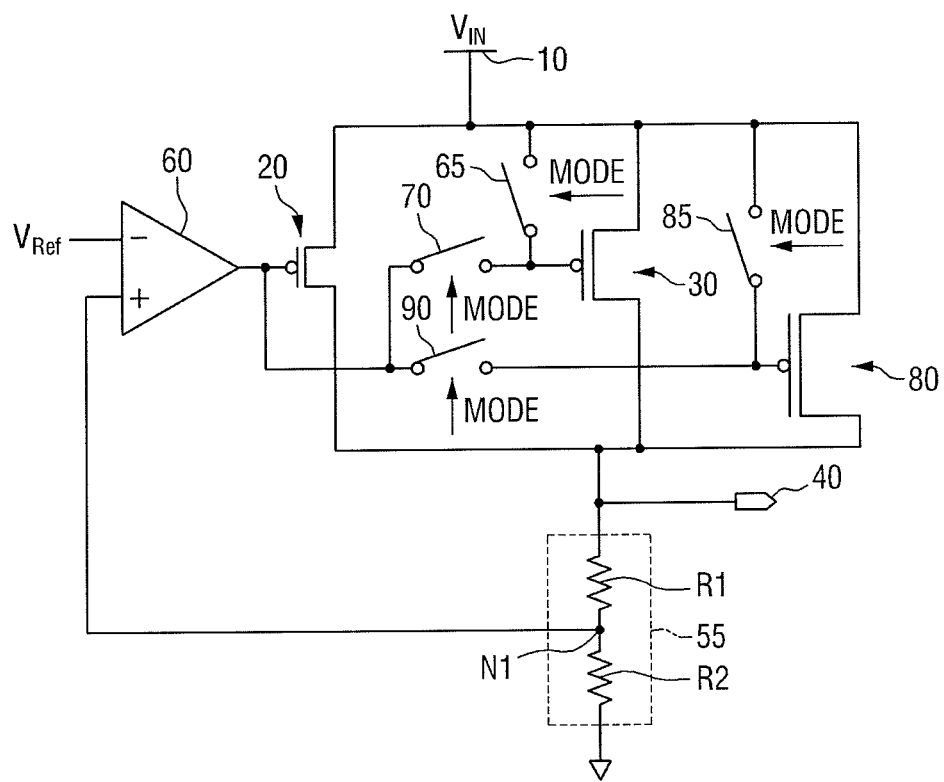
FIG. 9 is a circuit diagram of a voltage regulator in accordance with an example embodiment of the present inventive concepts.

FIG. 9 is a circuit diagram of the voltage regulator 102 in accordance with the example embodiment of FIG. 8 of the present inventive concepts.

Referring to FIG. 9, the voltage regulator 102 includes the first transistor 20, the second transistor 30, the third transistor 80, the feedback network 55, and the amplifier 60.

The first, second and third transistors 20, 30 and 80 may be connected in parallel between the power source terminal 10, which supplies the voltage of the power source Vin, and the output terminal 40, which outputs the load current (not shown) as illustrated.

Specifically, the first transistor 20 may have a first terminal connected to the power source terminal 10, a second terminal connected to the output terminal 40, and a gate terminal connected to the amplifier 60. The second transistor 30 may have a first terminal connected to the power source terminal 10, a second terminal connected to the output terminal 40, and a gate terminal connected to one end of each of the first switch 65 and the second switch 70. At this time, as illustrated, one end of the first switch 65 may be connected to the gate terminal of the second transistor 30 and the other end of the first switch 65 may be connected to the power source terminal 10. One end of the second switch 70 may be connected to the gate terminal of the second transistor 30 and the other end of the second switch 70 may be connected to the amplifier 60. The third transistor 80 may have a first terminal connected to the power source terminal 10, a second terminal connected to the output terminal 40, and a gate terminal connected to one end of each of a third switch 85 and a fourth switch 90. In this embodiment, as illustrated, one end of the third switch 85 may be connected to the gate terminal of the third transistor 80 and the other end of the third switch 85 may be connected to the power source terminal 10. One end of the fourth switch 90 may be connected to the gate terminal of the third transistor 80 and the other end of the fourth switch 90 may be connected to the amplifier 60.

In this example embodiment, each of the first, second, third and fourth switches 65, 70, 85 and 90 may be turned on/off according to the mode of the voltage regulator 102. Specifically, in the first mode, for example, the power saving mode, the first and third switches 65 and 85 may be turned on and the second and fourth switches 70 and 90 may be turned off. In the second mode, for example, the first active mode, the second and third switches 70 and 85 may be turned on and the first and fourth switches 65 and 90 may be turned off. In the third mode, for example, the second active mode, the second and fourth switches 70 and 90 may be turned on, and the first and third switches 65 and 85 may be turned off.

According to this configuration, the first transistor 20 may be enabled in the first, second and third modes, for example, the power saving mode, the first active mode and the second active mode. The second transistor 30 may be disabled in the first mode, for example, the power saving mode, and enabled in the second and third modes, for example, the first active mode and the second active mode. The third transistor 80 may be disabled in the first and second modes, for example, the power saving mode and the first active mode, and enabled in the third mode, for example, the second active mode. A specific operation of the voltage regulator 102 according to this example embodiment will be described hereinafter.

In some embodiments of the present inventive concepts, all of the first, second and third transistors 20, 30 and 80 may be configured as PMOS transistors as illustrated; however, the present inventive concepts are not limited thereto. The first, second and third transistors 20, 30 and 80 may be included in one voltage regulator 102, as illustrated. That is, the voltage regulator 102 according to this example embodiment may include the first, second and third transistors 20, 30 and 80 which are separated from each other and have different sizes.

The feedback network 55 and the amplifier 60 may serve to apply the voltage of the output terminal 40 to the gate terminal of the first, second and third transistors 20, 30 and 80. Specifically, one end of the feedback network 55 may be connected to the output terminal 40, and the other end of the feedback network 55 may be connected to the amplifier 60 such that the feedback network 55 serves to apply at least a portion of the voltage of the output terminal 40 to the amplifier 60. Further, the amplifier 60 may serve to amplify the voltage provided from the feedback network 55 after comparison with the reference voltage Vref. The amplified voltage may be provided to the gate terminals of the first, second and third transistors 20, 30 and 80 based on an operation mode of the portable electronic device, as illustrated.

The voltage regulator 102 according to the configuration of this example embodiment may provide the first, second and third load currents (not shown) having different magnitudes to the output terminal 40. Hereinafter, the operation of the voltage regulator 102 in accordance with the example embodiment of FIG. 9 of the present inventive concepts will be described in more detail with reference to FIGS. 10 to 12.

Figure 10:
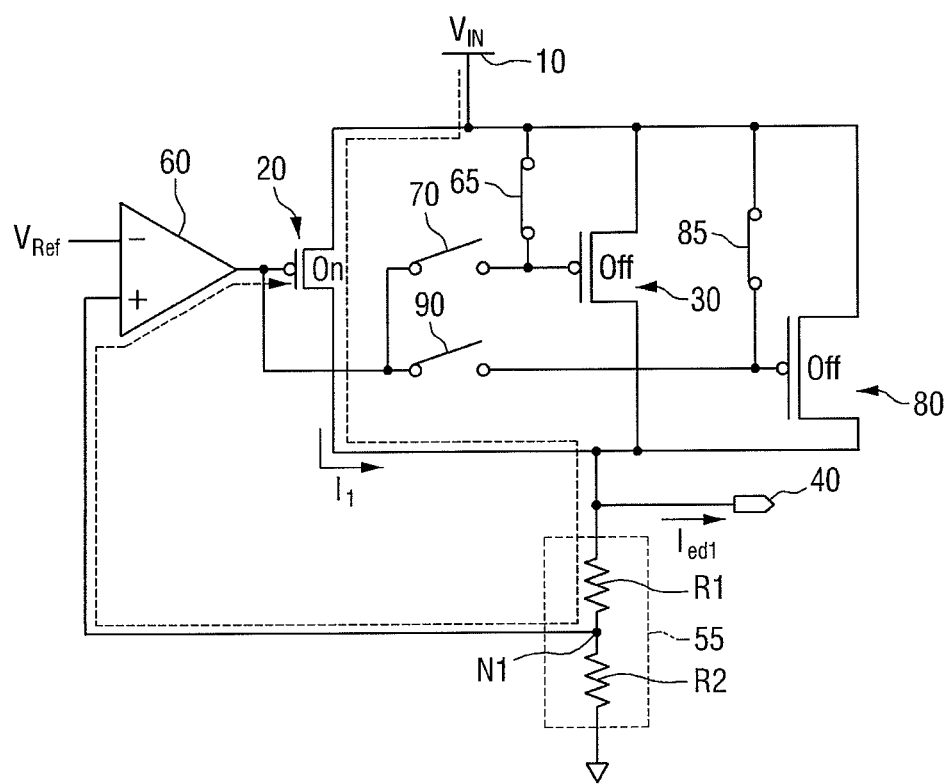
FIGS. 10 to 12 are circuit diagrams illustrating operation of the voltage regulator of FIG. 9 in accordance with the example embodiment of the present inventive concepts.
Figure 11:
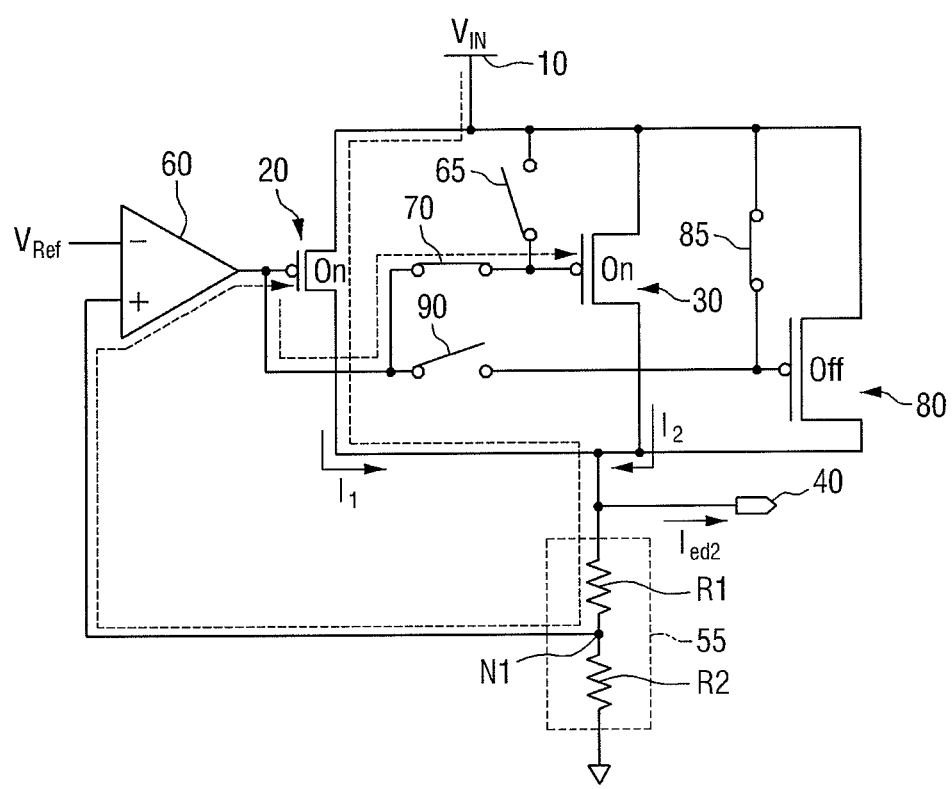
Figure 12:
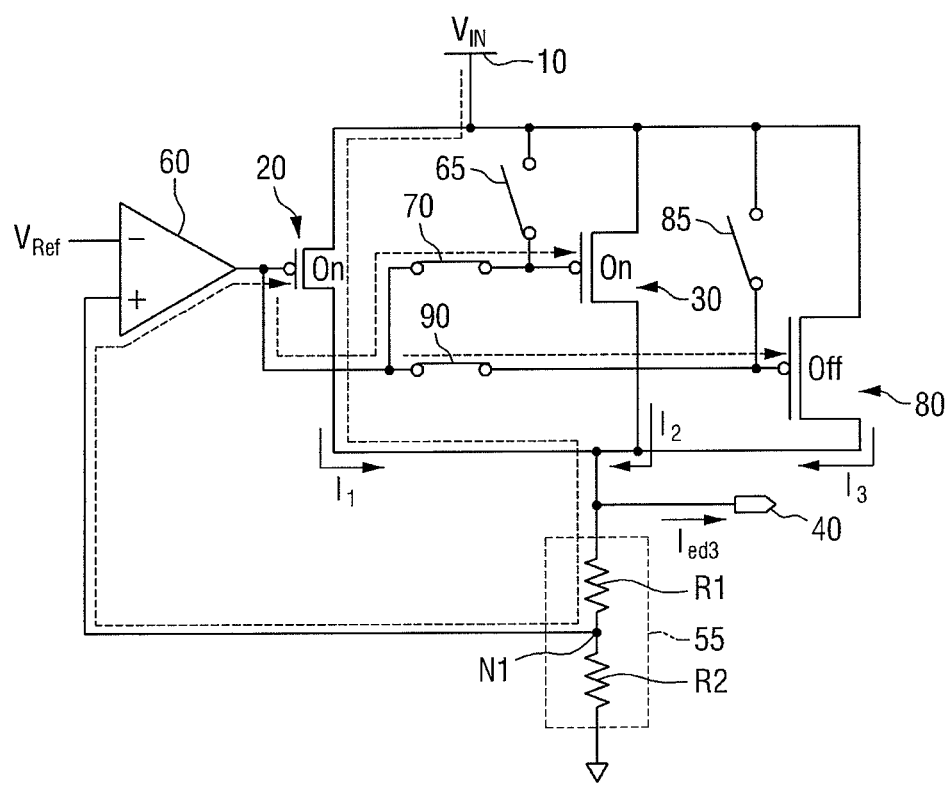

FIGS. 10 to 12 are diagrams illustrating the operation of the voltage regulator 102 in accordance with the example embodiment of FIG. 9 of the present inventive concepts.

First, referring to FIG. 10, in the first mode, for example, the power saving mode, the voltage supplied from the power source Vin is inverted and amplified through the feedback network 55 and the amplifier 60 to be supplied to the gate terminal of the first transistor 20, and, thus, the first transistor 20 is enabled. At this time, the second and fourth switches 70 and 90 are off, that is, in an open position, and the inverted and amplified voltage supplied from the amplifier 60 is not provided to the gate terminal of the second and third transistors 30 and 80 (see dashed line). Since the first and third switches 65 and 85 are on, that is, in a closed position, and the voltage of the power source Vin is supplied to the gate terminal of the second and third transistors 30 and 80, respectively, the second and third transistors 30 and 80 are disabled. That is, in the first mode, for example, the power saving mode, the first transistor 20 is enabled and the second and third transistors 30 and 80 are disabled.

Accordingly, in the first mode, the first transistor 20 generates the first current I1 and provides the first current I1 to the output terminal 40, but the second and third transistors 30 and 80 do not generate a current. Thus, in the first mode, the first current I1 is outputted as the first load current Ied1 to the output terminal 40.

Next, referring to FIG. 11, in the second mode, for example, the first active mode, the voltage supplied from the power source Vin is inverted and amplified through the feedback network 55 and the amplifier 60 to be supplied to the gate terminal of the first transistor 20, and, thus, the first transistor 20 is enabled. Further, since the second switch 70 is on, that is, in a closed position, and the inverted and amplified voltage supplied from the amplifier 60 is also provided to the gate terminal of the second transistor 30, the second transistor 30 is also enabled (see dashed line). However, since the fourth switch 90 is off, that is, in an open position, and the inverted and amplified voltage supplied from the amplifier 60 is not provided to the gate terminal of the third transistor 80, the third transistor 80 is disabled.

At this time, the first switch 65 is off, that is, in an open position, and the voltage of the power source Vin is not supplied to the gate terminal of the second transistor 30. However, the third switch 85 is on, that is, in a closed position, and the voltage of the power source Vin is supplied to the gate terminal of the third transistor 80. Accordingly, in the second mode, for example, the first active mode, the first transistor 20 and the second transistor 30 are enabled and the third transistor 80 is disabled.

Accordingly, in the second mode, the first transistor 20 generates the first current I1 and provides the first current I1 to the output terminal 40, and the second transistor 30 generates the second current I2 and provides the second current I2 to the output terminal 40. However, in the second mode, the third transistor 80 does not generate a current. Consequently, in the second mode, the sum of the first current I1 and the second current I2 is outputted as the second load current Ied2 to the output terminal 40.

In this embodiment, the size of the first transistor 20 may be smaller than the size of the second transistor 30. Accordingly, the magnitude of the current generated by the first transistor 20 may be smaller than the magnitude of the current generated by the second transistor 30.

Next, referring to FIG. 12, in the third mode, for example, the second active mode, the voltage supplied from the power source Vin is inverted and amplified through the feedback network 55 and the amplifier 60 to be supplied to the gate terminal of the first transistor 20, and thus, the first transistor 20 is enabled. Further, since the second and fourth switches 70 and 90 are on, that is, in a closed position, and the inverted and amplified voltage from the amplifier 60 is also provided to the gate terminal of the second and third transistors 30 and 80, the second and third transistors 30 and 80 are also enabled (see dashed line). At this time, the first and third switches 65 and 85 are off and the voltage of the power source Vin is not supplied to the gate terminal of the second and third transistors 30 and 80. That is, in the third mode, for example, the second active mode, all of the first, second and third transistors 20, 30 and 80 are enabled.

Accordingly, in the third mode, the first transistor 20 generates the first current I1 and provides the first current I1 to the output terminal 40, the second transistor 30 generates the second current I2 and provides the second current I2 to the output terminal 40, and the third transistor 80 generates a third current I3 and provides the third current I3 to the output terminal 40. Consequently, the sum of the first, second and third currents I1, I2 and I3 is outputted as the third load current Ied3 to the output terminal 40.

In this example embodiment, the size of the first transistor 20 may be smaller than the size of the second transistor 30, and the size of the second transistor 30 may be smaller than the size of the third transistor 80. Accordingly, the magnitude of the current generated by the first transistor 20 may be smaller than the magnitude of the current generated by the second transistor 30, and the magnitude of the current generated by the second transistor 30 may be smaller than the magnitude of the current generated by the third transistor 80.

In this example embodiment in which the first, second and third load currents Ied1, Ied2 and Ied3 having different magnitudes are generated according to the mode in one, single voltage regulator 102, it is possible to improve the operational reliability. Since a detailed description thereof has been fully explained above, a repeated description will be omitted.

Next, a memory chip in accordance with an example embodiment of the present inventive concepts will be described with reference to FIG. 13.

Figure 13:
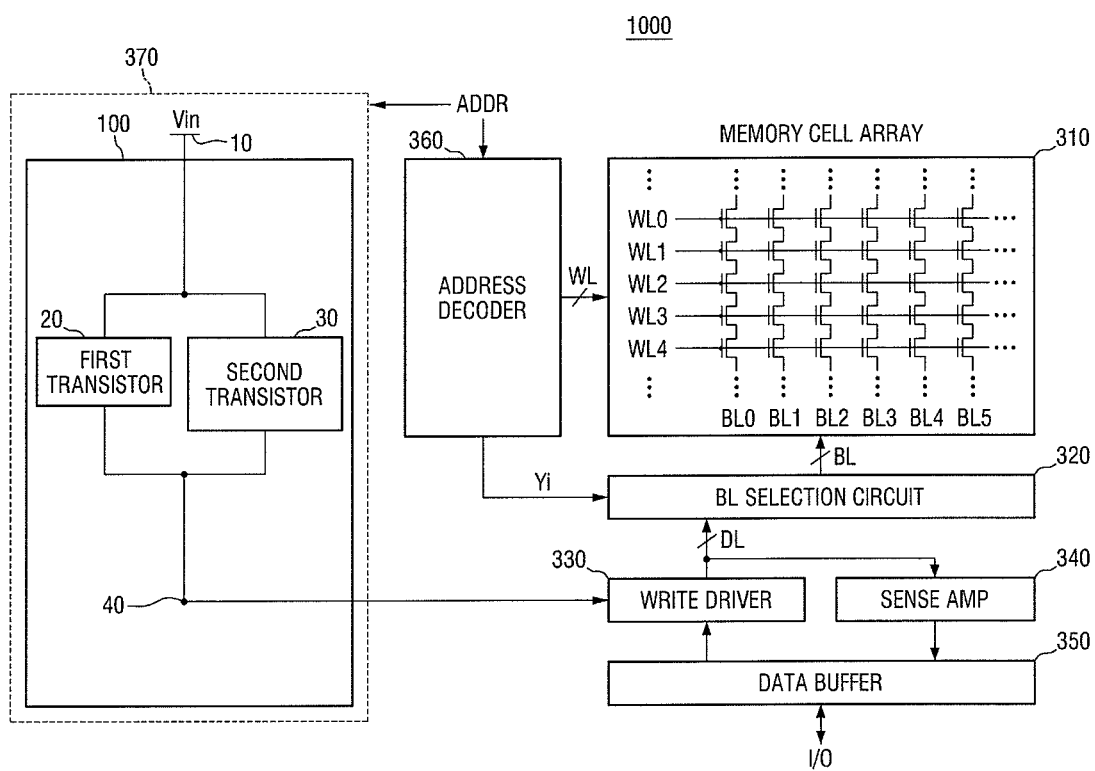
FIG. 13 is a conceptual block diagram of a memory chip in accordance with an example embodiment of the present inventive concepts.

FIG. 13 is a conceptual block diagram of a memory chip 1000 in accordance with an example embodiment of the present inventive concepts.

Referring to FIG. 13, a memory chip 1000 includes a memory cell array 310, a bit line (BL) selection circuit 320, a write driver 330, a sense amplifier circuit 340, a data input/output (I/O) buffer circuit 350, an address decoder 360, and the voltage regulator 100 as described above.

Each memory cell in the memory cell array 310 may include a memory element. In particular, in this example embodiment, the memory cell may include a non-volatile memory cell.

Each memory cell in the memory cell array 310 may include a memory element and a select element, although the memory cells are not shown in detail. In some example embodiments of the present inventive concepts, each of the memory element and the select element may be implemented as a transistor.

The address decoder 360 is connected to the memory cell array 310 through word lines WL. The address decoder 360 decodes an address signal ADDR inputted externally, and provides a bias voltage to a selected word line. Further, the address decoder 360 generates a selection signal Yi for selecting a bit line BL, and provides the selection signal Yi to the BL selection circuit 320.

The BL selection circuit 320 is connected to the memory cell array 310 through the bit lines BL. The BL selection circuit 320 selects the bit line BL of the memory cell array 310 in response to the selection signal Yi provided from the address decoder 360 in a read operation and a program operation. The BL selection circuit 320 may include a plurality of NMOS transistors, and the NMOS transistors may electrically connect the bit lines BL to data lines DL.

The write driver 330 receives data to be programmed into a programming target memory cell of the memory cell array 310 from the data I/O buffer circuit 350, and outputs a corresponding write current, for example, the load current, to the programming target memory cell of the memory cell array 310. In this embodiment, the write current, for example, the load current, provided to the write driver 330 may be the current provided from the voltage regulator 100, as described above.

In a read operation, the sense amplifier circuit 340 reads the data stored in the memory cell of the memory cell array 310 and outputs the data to the data I/O buffer circuit 350. Further, in a program verify operation, the sense amplifier circuit 340 may read the data stored in the memory cell to perform the program verify operation. The operations of the write driver 330 and the sense amplifier circuit 340 may be controlled by a control signal of a controller 370.

The voltage regulator 100 may provide the load current, which is outputted to the programming target memory cell of the memory cell array 310, to the write driver 330. That is, if a large amount of load current is required because there are many programming target memory cells in the memory cell array 310, the voltage regulator 100 operates in the second mode, for example, the active mode, and provides a large amount of load current to the write driver 330. If a small amount of load current is required because there are few programming target memory cells in the memory cell array 310, the voltage regulator 100 operates in the first mode, for example, the power saving mode, and provides a small amount of load current to the write driver 330. In some embodiments of the present inventive concepts, the first mode, for example, the power saving mode, and the second mode, for example, the active mode, of the voltage regulator 100 may be determined by the address signal ADDR; however, the present inventive concepts are not limited thereto. A specific operation of the voltage regulator 100 will be described hereinafter.

In some embodiments of the present inventive concepts, the voltage regulator 100 may be disposed in the controller 370 of the memory chip 1000, as illustrated. However, the present inventive concepts are not limited thereto, and the voltage regulator 100 may be configured separately from the controller 370, unlike the illustrated example embodiment.

Hereinafter, the operation of the memory chip 1000 in accordance with the example embodiment of FIG. 13 of the present inventive concepts will be described with reference to FIGS. 14 and 15.

Figure 14:
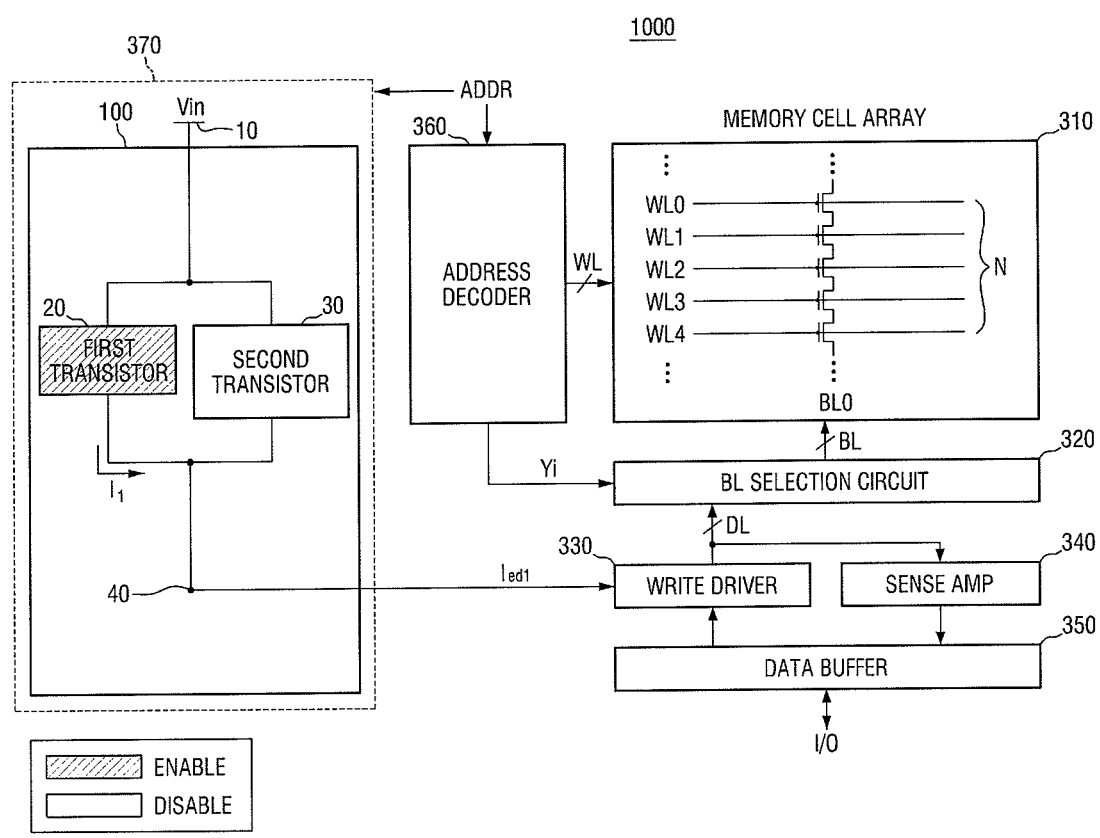
FIGS. 14 and 15 are block diagrams illustrating operation of the memory chip of FIG. 13 in accordance with the example embodiment of the present inventive concepts.
Figure 15:
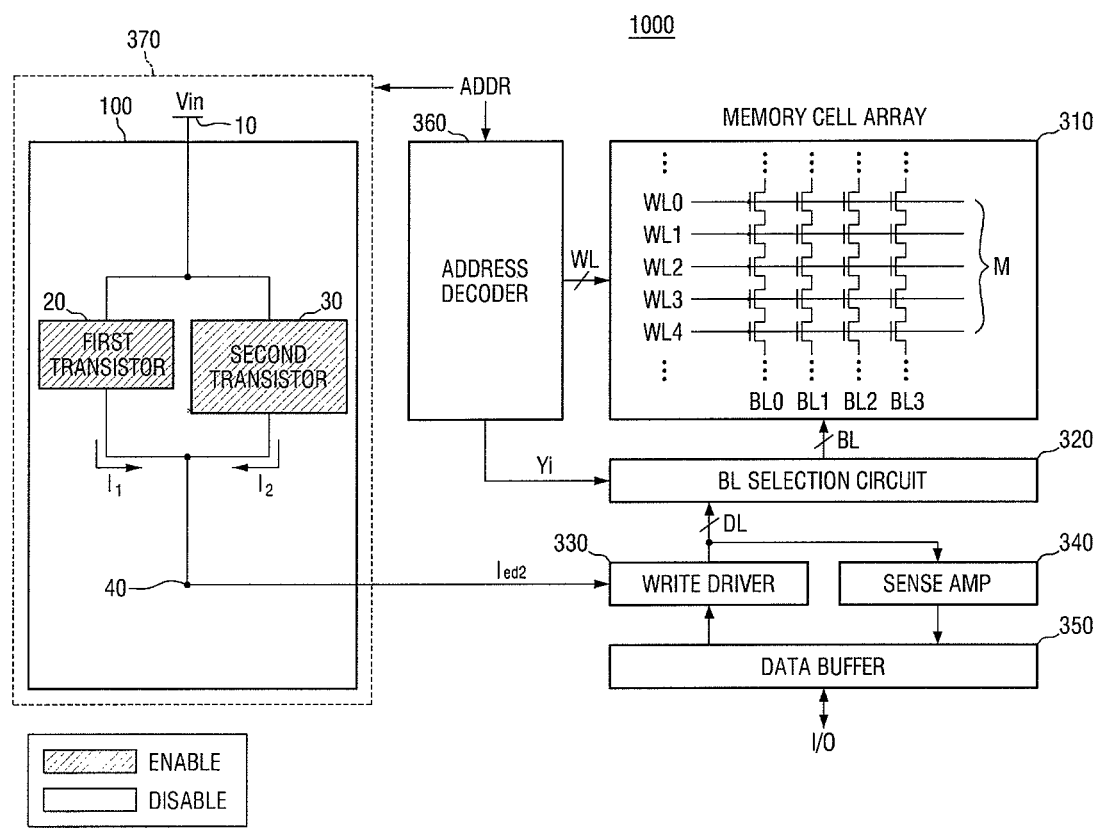

FIGS. 14 and 15 are circuit diagrams illustrating the operation of the memory chip 1000 in accordance with the example embodiment of the present inventive concepts.

First, referring to FIG. 14, in an embodiment in which it is required to drive N memory cells (N is a natural number) among a plurality of memory cells of the memory cell array 310, the voltage regulator 100 may operate in the first mode, for example, the power saving mode. Accordingly, the voltage regulator 100 may generate the first load current Ied1 for driving the N memory cells and provide the first load current Ied1 to the write driver 330. In this example embodiment, the second transistor 30 of the voltage regulator 100 is disabled, and the first transistor 20 of the voltage regulator 100 is enabled to generate the first current I1, as described above. The generated first current I1 is provided as the first load current Ied1 to the write driver 330.

Next, referring to FIG. 15, in an embodiment in which it is required to drive M memory cells (M is a natural number greater than N) among a plurality of memory cells of the memory cell array 310, the voltage regulator 100 may operate in the second mode, for example, the active mode. Accordingly, the voltage regulator 100 may generate the second load current Ied2 for driving the M memory cells and provide the second load current Ied2 to the write driver 330. In this embodiment, both the first transistor 20 and the second transistor 30 of the voltage regulator 100 may be enabled to generate the second load current Ied2, as described above. The magnitude of the second load current Ied2 for driving the M memory cells may be larger than the magnitude of the first load current Ied1 for driving the N memory cells.

The voltage regulator 100 in which the first and second transistors 20 and 30 having different sizes are connected in parallel between the power source terminal 10 and the output terminal 40 has been illustrated in the drawings; however, the configuration of the memory chip 1000 of the present inventive concepts is not limited thereto. In some other embodiments of the present inventive concepts, the memory chip 1000 may include the voltage regulator 102 in which the first, second and third transistors 20, 30 and 80 having different sizes are connected in parallel between the power source terminal 10 and the output terminal 40, as described above.

Next, a memory device in accordance with an example embodiment of the present inventive concepts will be described with reference to FIG. 16. The following description will be made using a solid state drive (SSD) as an example of the memory device; however, the present inventive concepts are not limited thereto.

Figure 16:
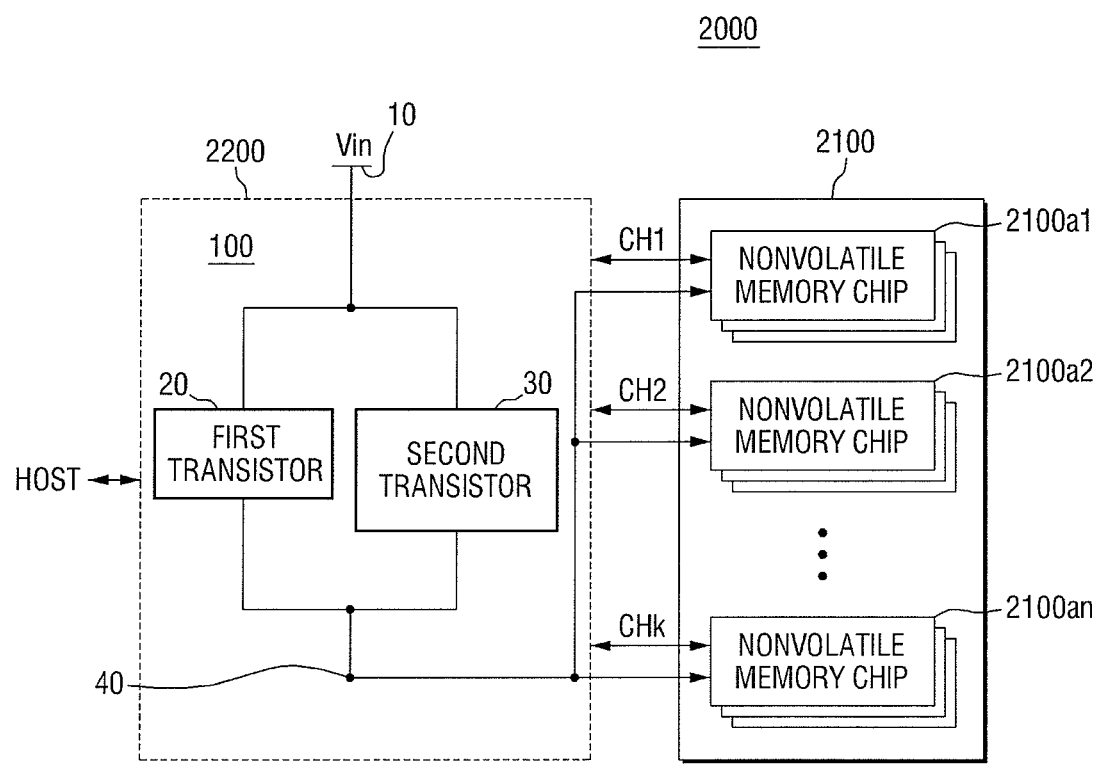
FIG. 16 is a conceptual block diagram of a memory device in accordance with an example embodiment of the present inventive concepts.

FIG. 16 is a conceptual block diagram of a memory device 2000 in accordance with an example embodiment of the present inventive concepts.

Referring to FIG. 16, a memory device 2000 includes a plurality of memory chips 2100 and a controller 2200. The memory chips may be classified into a plurality of groups, for example, first to nth groups 2100a1 to 2100an. Each group of the memory chips may be configured to perform communication with the controller 2200 via one common channel. For example, the memory chips perform communication with the controller 2200 via first to k-th channels CH1 to CHk.

A case where a plurality of memory chips are connected to one channel has been illustrated in FIG. 16, but the present inventive concepts are not limited thereto. In some embodiments of the present inventive concepts, the memory device 2000 may be modified such that one memory chip is connected to one channel.

The memory chips 2100 or the memory device 2000 may be mounted as various types of packages. For example, the memory chips 2100 or the memory device 2000 may be mounted as a package such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), and/or wafer-level processed stack package (WSP).

The controller 2200 may be connected to a host and the memory chips 2100. In response to a request from the host, the controller 2200 may be configured to access the memory chips 2100. For example, the controller 2200 may be configured to control read, write, erase and background operations of the memory chips 2100. The controller 2200 may be configured to provide an interface between the memory chips 2100 and the host. In this embodiment, the controller 2200 may be configured to drive firmware for controlling the memory chips 2100.

For instance, the controller 2200 may further include well-known components such as a random access memory (RAM), a processing unit, a host interface, and a memory interface. The RAM is used as at least one of an operation memory of the processing unit, a cache memory between the memory chips 2100 and the host, and a buffer memory between the memory chips 2100 and the host. The processing unit controls all operations of the controller 2200.

The host interface includes a protocol for performing data exchange between the host and the controller 2200. For example, the controller 2200 is configured to perform communication with the outside, for example, the host, through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface interfaces with the memory chips 2100. For example, the memory interface includes a NAND interface or NOR interface.

The controller 2200 of the memory device 2000 may include the voltage regulator 100, in accordance with the embodiments of the present inventive concepts. Hereinafter, the operation of the memory device 2000 in accordance with the example embodiment of FIG. 16 of the present inventive concepts will be described in more detail with reference to FIGS. 17 and 18.

Figure 17:
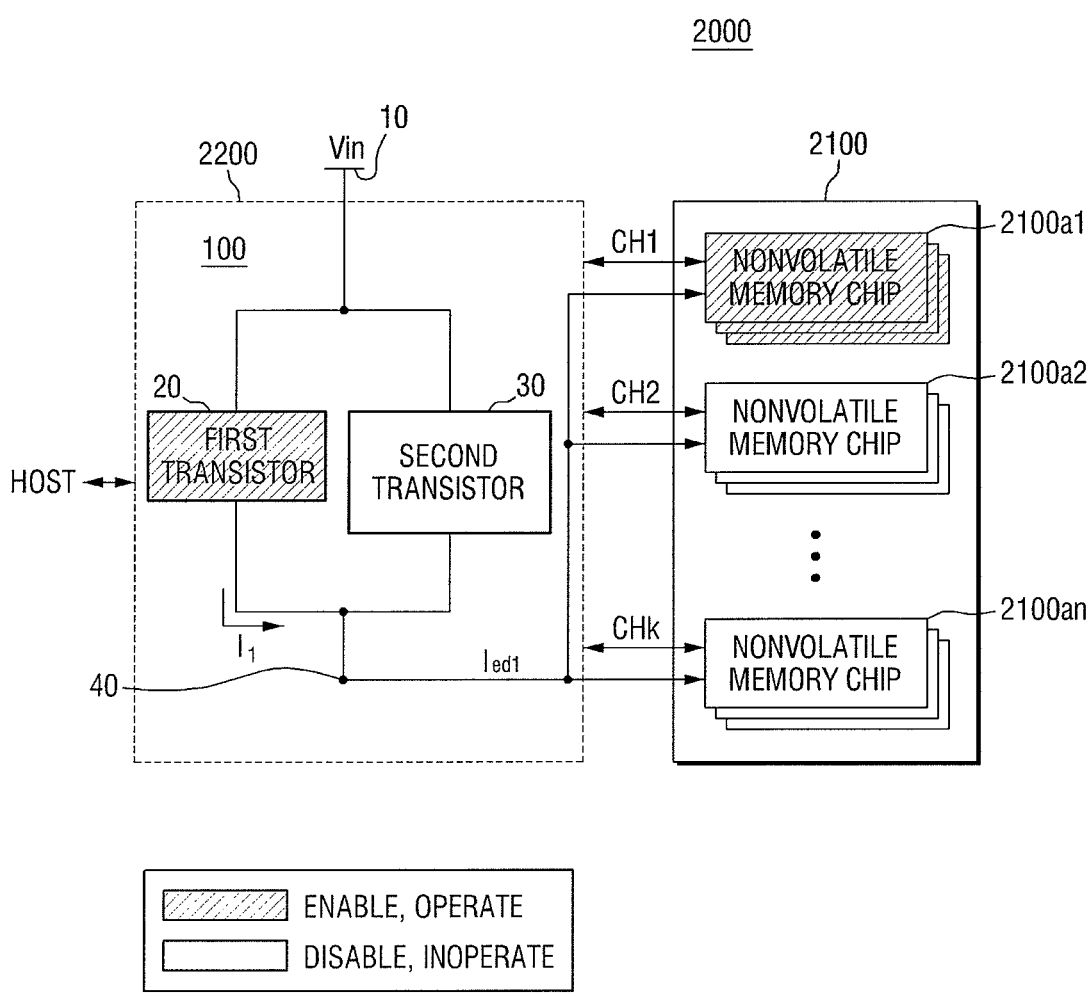
FIGS. 17 and 18 are block diagrams illustrating operation of the memory device of FIG. 16 in accordance with the example embodiment of the present inventive concepts.
Figure 18:
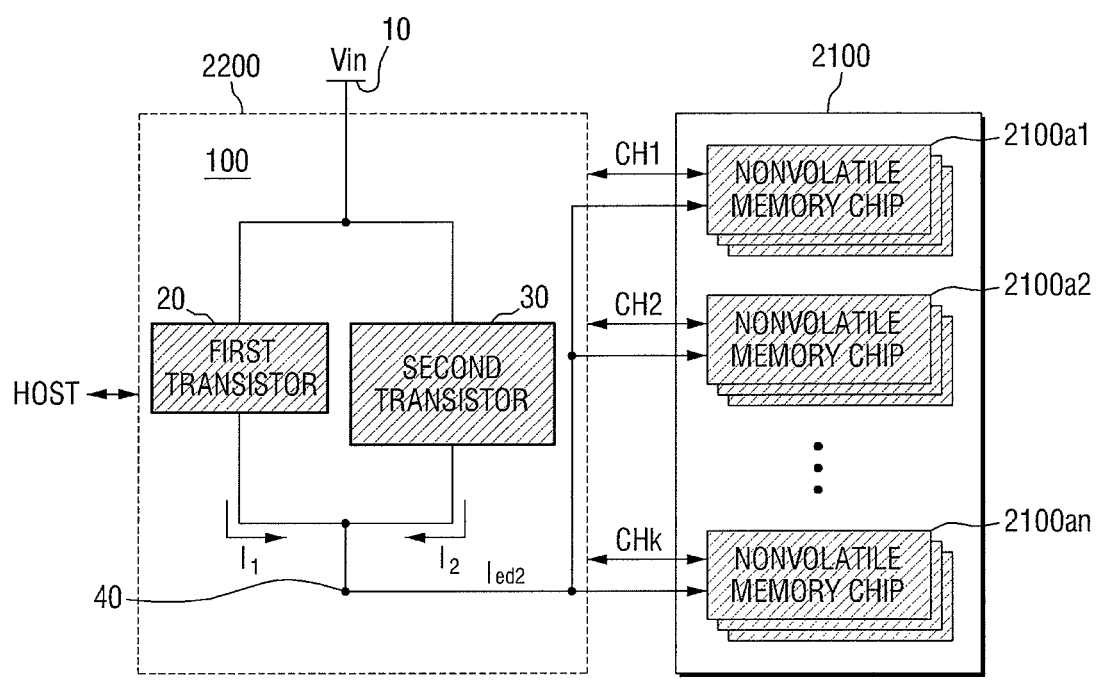

FIGS. 17 and 18 are block diagrams illustrating the operation of the memory device 2000 in accordance with the example embodiment of the present inventive concepts.

First, referring to FIG. 17, in a case where it is required to drive N memory chips (N is a natural number) among the memory chips 2100, the voltage regulator 100 may operate in the first mode, for example, the power saving mode. Accordingly, the voltage regulator 100 may generate the first load current Ied1 for driving the N memory chips and provide the first load current Ied1 to the N memory chips. In this example embodiment, the second transistor 30 of the voltage regulator 100 is disabled and the first transistor 20 of the voltage regulator 100 is enabled to generate the first current I1. The generated first current I1 is provided as the first load current Ied1 to the N memory chips.

Next, referring to FIG. 18, in an embodiment in which it is required to drive M memory chips (M is a natural number greater than N) among the memory chips 2100, the voltage regulator 100 may operate in the second mode, for example, the active mode. Accordingly, the voltage regulator 100 may generate the second load current Ied2 for driving the M memory cells and provide the second load current Ied2 to the M memory chips. In this embodiment, both the first transistor 20 and the second transistor 30 of the voltage regulator 100 may be enabled to generate the second load current Ied2. The magnitude of the second load current Ied2 for driving the M memory chips may be larger than the magnitude of the first load current Ied1 for driving the N memory chips.

The voltage regulator 100 in which the first and second transistors 20 and 30 having different sizes are connected in parallel between the power source terminal 10 and the output terminal 40 has been illustrated in the drawings; however the configuration of the memory device 2000 of the present inventive concepts is not limited thereto. In some other embodiments of the present inventive concepts, the memory device 2000 may include the voltage regulator 102 in which the first, second and third transistors 20, 30 and 80 having different sizes are connected in parallel between the power source terminal 10 and the output terminal 40, as described above.

Next, a memory system in accordance with an example embodiment of the present inventive concepts will be described with reference to FIG. 19.

Figure 19:
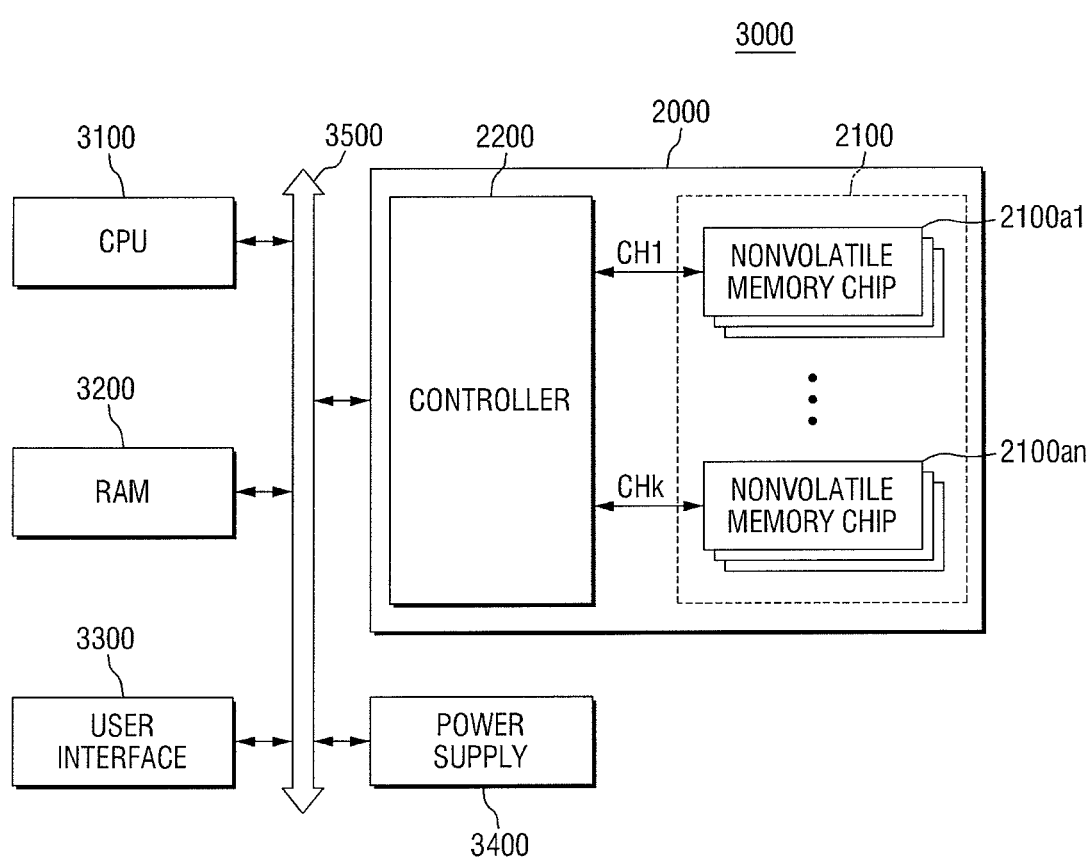
FIG. 19 is a conceptual block diagram showing a memory system in accordance with an example embodiment of the present inventive concepts.

FIG. 19 is a conceptual block diagram illustrating a memory system 3000 in accordance with an example embodiment of the present inventive concepts.

Referring to FIG. 19, the memory system 3000 includes a central processing unit 3100, a random access memory (RAM) 3200, a user interface 3300, a power supply 3400, and the memory device 2000, as described above.

The memory device 2000 may be electrically connected to the central processing unit 3100, the RAM 3200, the user interface 3300 and the power supply 3400 via a system bus 3500. The data provided through the user interface 3300 or processed by the central processing unit 3100 may be stored in the memory device 2000.

The controller 2200 and the memory chips 2100 may be integrated into a single semiconductor device. The controller 2200 and the memory chips 2100 may be integrated into a single semiconductor device to form a memory card. For example, the controller 2200 and the memory chips 2100 may be integrated into one semiconductor device to constitute a memory card such as a PC card (personal computer memory card international association (PCMCIA)), a compact flash card (CF), a smart media card (SM, SMC), a memory stick, a multimedia card (MMC, RS-MMC, MMCmicro), a SD card (SD, miniSD, microSD, SDHC), a universal flash storage device (UFS) and the like.

The memory system 3000 may be provided as one of various components of an electronic device such as a computer, a ultra mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system, but the present invention is not limited thereto.

While the inventive concepts have been particularly shown and described with reference to example embodiments thereof, it will be understood that various changes in form and details may be made therein without departing from the spirit and scope of the following claims.

What is claimed is:

1. A voltage regulator comprising:
a power source terminal configured to supply a power source voltage;
an output terminal configured to output a load current;
a first transistor which have a first terminal connected to the power source terminal, a second terminal connected to the output terminal, and a gate terminal connected to an amplifier;
a second transistor which have a first terminal connected to the power source terminal, a second terminal connected to the output terminal, and a gate terminal connected to one end of each of a First switch and a second switch,
wherein the other end of the first switch is connected to the power source terminal, and the other end of the second switch is connected to the amplifier; and
a third transistor having a first terminal connected to the power source terminal, a second terminal connected to the output terminal, and a gate terminal connected to one end of each of a third switch and a fourth switch,
wherein the other end of the third switch is connected to the power source terminal, and the other end of the fourth switch is connected to the amplifier,
wherein, in a first mode, the first switch and the third switch are turned on, and the second switch and the fourth switch are turned off,
wherein in a second mode different from the first mode, the second switch and the third switch are turned on, and the first switch and the fourth switch are turned off, and
wherein in a third mode different from the first and second modes, the second switch and the fourth switch are turned on, and the first switch and the third switch are turned off, and
wherein an output of the amplifier in the first mode is the same as an output of the amplifier in the second mode and the output of the amplifier in the second mode is the same as an output of the amplifier in the third mode.

2. The voltage regulator of claim 1, wherein the first switch is turned on in a first mode, and turned off in a second mode and wherein the second mode is different from the first mode.

3. The voltage regulator of claim 2, wherein the second switch is turned off in the first mode, and turned on in the second mode.

4. The voltage regulator of claim 3, wherein the first mode comprises a power saving mode, and the second mode comprises an active mode.

5. The voltage regulator of claim 1, wherein the first transistor and the second transistor comprise PMOS transistors.

6. The voltage regulator of claim 1, wherein a size of the first transistor is different from a size of the second transistor.

7. The voltage regulator of claim 6, wherein the size of the second transistor is larger than the size of the first transistor.

* * * * *